(12) United States Patent
Schuckman et al.

(10) Patent No.: US 8,877,632 B1
(45) Date of Patent: Nov. 4, 2014

(54) PROVIDING A VOID-FREE FILLED INTERCONNECT STRUCTURE IN A LAYER OF PACKAGE SUBSTRATE

(71) Applicants: Amanda E. Schuckman, Scottsdale, AZ (US); Mark S. Hlad, Chandler, AZ (US)

(72) Inventors: Amanda E. Schuckman, Scottsdale, AZ (US); Mark S. Hlad, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/893,183

(22) Filed: May 13, 2013

(51) Int. Cl.
  *H01L 23/48* (2006.01)
  *H01L 23/522* (2006.01)
  *H01L 21/768* (2006.01)
(52) U.S. Cl.
  CPC ...... *H01L 21/76877* (2013.01); *H01L 23/5226* (2013.01); *H01L 21/76802* (2013.01)
  USPC ............................ 438/625; 257/774; 205/103

(58) Field of Classification Search
  USPC ................ 257/774; 438/625; 205/81, 84, 103
  See application file for complete search history.

(56) References Cited

U.S. PATENT DOCUMENTS

| 6,340,633 | B1 * | 1/2002 | Lopatin et al. | 438/625 |
| 6,913,680 | B1 * | 7/2005 | Zheng et al. | 205/102 |
| 7,850,836 | B2 * | 12/2010 | Dixit et al. | 205/84 |

* cited by examiner

*Primary Examiner* — Roy Potter
(74) *Attorney, Agent, or Firm* — Schwabe, Williamson & Wyatt, P.C.

(57) ABSTRACT

Embodiments of the present disclosure are directed towards techniques and configurations for providing void-free filled interconnect structures in a dielectric layer of a package assembly. In one embodiment, the method for providing a void-free filled interconnect structure may include forming a through hole through a layer of a package substrate, and depositing a conductive material to fill the through hole. Depositing the conductive material may be performed while gradually increasing a current density of the conductive material and correspondingly changing a flow rate of the conductive material. Other embodiments may be described and/or claimed.

21 Claims, 5 Drawing Sheets

PROVIDING A VOID-FREE FILLED INTERCONNECT STRUCTURE IN A LAYER OF PACKAGE SUBSTRATE

FIELD

Embodiments of the present disclosure generally relate to the field of integrated circuits (IC), and more particularly, to techniques and configurations for providing void-free filled interconnect structures in the core material of an IC substrate.

BACKGROUND

Electrical performance of an interconnect structure, such as one including a filled through hole with conductive material in an IC substrate, may be adversely affected by undesired electrical resistivity of the interconnect structure resulting from deficiencies in manufacturing such an interconnect structure. For example, a laser drilled through hole may potentially have high wall roughness, asymmetrical shape with dimensional variations, and misalignments at the top and bottom diameter of the through hole. A combination of these factors may result in voids when filling the through hole with a conductive material (e.g., by plating copper) to form an interconnect structure. The formation of voids may lead to reduced current carrying capability of the interconnect structure. Using a single current density during the filling process may increase the probability of voids forming and may potentially lead to long plating times and large recesses in the filled interconnect.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe techniques and configurations for providing void-free filled interconnect structures in a core material of an IC substrate using controlled current density and solution flow. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first layer formed, deposited, or otherwise disposed on a second layer," may mean that the first layer is formed, deposited, or disposed over the second layer, and at least a part of the first layer may be in direct contact (e.g., direct physical and/or electrical contact) or indirect contact (e.g., having one or more other layers between the first layer and the second layer) with at least a part of the second layer.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Figure 1:
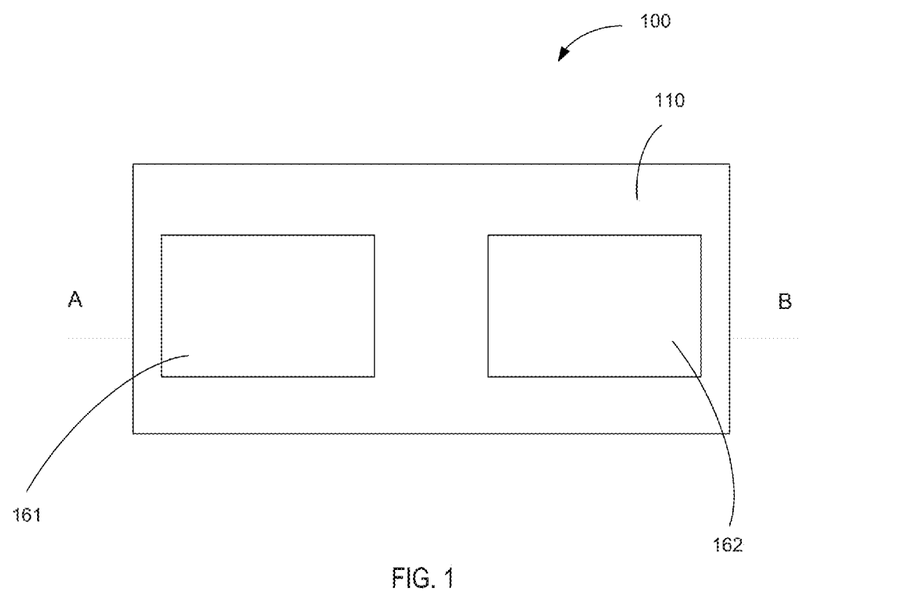
FIG. 1 schematically illustrates a top view of an example integrated circuit (IC) package assembly including a void-free filled interconnect structure in the core material of an IC substrate, in accordance with some embodiments.

FIG. 1 is a plan view of an example integrated circuit (IC) package assembly 100, in accordance with some embodiments. As illustrated in FIG. 1, the IC package assembly 100 may comprise a package substrate 110. The package substrate 110 may be an organic substrate including, for example, build-up layers configured to route electrical signals through the IC package assembly 100. The package assembly 100 may further comprise one or more interconnect structures (described in reference to FIG. 2) connecting different conductive layers of the substrate with each other to provide electrical connection for one or more dies 161, 162 disposed on or over the package substrate 110. The techniques for providing the interconnect structures, such as structures with void-free filled through holes will be depicted in subsequent figures and further discussed below. It should be understood that the dies 161, 162 are depicted for illustrative purposes only. The package substrate 110 with interconnect structures described herein may be employed in different implementations of systems and apparatuses that may include IC package assembly 100.

Figure 2:
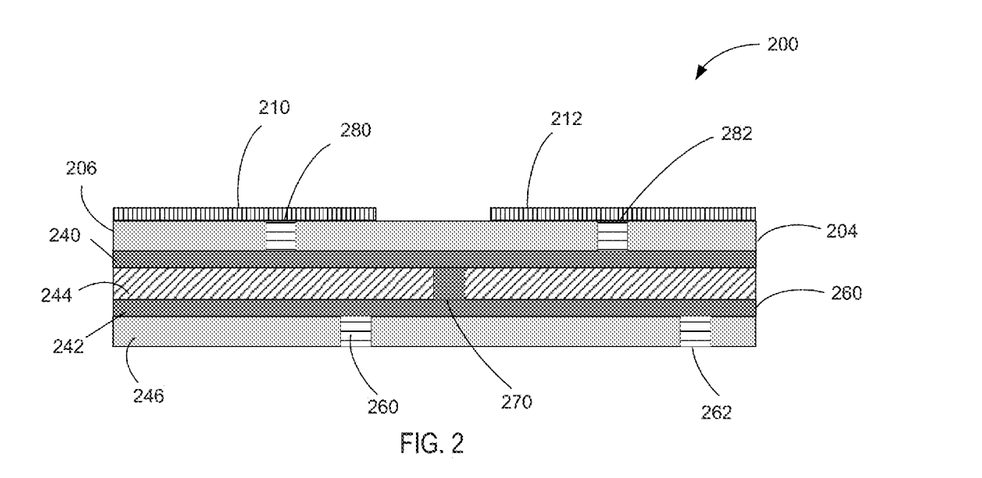
FIG. 2 schematically illustrates a cross-section side view of the example integrated circuit (IC) package assembly of FIG. 1, in accordance with some embodiments.

FIG. 2 schematically illustrates a cross-section side view of an example IC package assembly 200, along the lines A and B, in reference to IC package assembly 100 of FIG. 1, in accordance with some embodiments. The IC package assembly 200 may include a package substrate 204 having one or more dies 210, 212 mounted on the package substrate 204. In some embodiments, the package substrate 204 may be an epoxy-based laminate substrate having a core and/or build-up layers such as, for example, a resin based epoxy with a silicon filler. The package substrate 204 may include other suitable types of substrates in other embodiments.

The dies 210, 212 may be attached to the package substrate 204 according to a variety of suitable configurations including, a flip-chip configuration, as depicted, or other configurations such as wirebonding and the like. In the flip-chip configuration, active sides of the dies 210, 212 may be attached to a surface of the package substrate 204 using various structures such as solder bumps or pillars (not shown). The active side of the dies 210, 212 may have one or more transistor devices formed thereon. Each of the dies 210, 212 may represent a discrete chip. The dies 210, 212 may be a part of a processor, memory, or application specific integrated circuit (ASIC) in some embodiments. The bottom of the package substrate may be populated with interconnect structures, such as ball, pin or land grid array (BGA, PGA, or LGA) to connect to the motherboard (not shown).

The dies 210, 212 may be electrically connected via conductive layers of the package substrate 204. More specifically, the dies 210, 212 may be electrically coupled to provide a chip-to-chip connection through the layers of the package substrate 204 and the interconnect structures (e.g., 270) configured to route electrical signals between the dies 210, 212. The dies 210, 212 may be coupled to a surface of the package substrate 204 to further route the electrical signals to other electrical devices such as, for example, a circuit board (e.g., motherboard 902 of FIG. 9) that may coupled with a surface of the package substrate that is opposite to the surface having the dies 210, 212 mounted thereon. In some embodiments, intervening materials or layers may be included in the IC package assembly 200. For example, the conductive (e.g., circuitry) layers such as layers 240 and 242 may be disposed as shown in FIG. 2. The conductive layers 240 and 242 may be connected through an interconnect structure 270 such as void-free conductive material-filled through hole in core layer 244. Such void-free interconnect structure 270 may include a through hole filled with conductive material having a void-free structure that is consistent with being deposited by gradual increase of a current density of the conductive material and corresponding gradual change of a flow rate of the conductive material. In some embodiments, the term "void-free" may be used to describe a filled through hole that is substantially void-free such that a void, when detected with an X-ray device, does not exceed 5 micrometers. In some embodiments, the conductive layers 240 and 242 may be patterned. The forming and composition of the interconnect structure 270 having a void-free filled through hole will be discussed in greater detail in reference to FIGS. 3-7. The core layer 244 may comprise an organic material, such as resin, in some embodiments.

Additional layers 206 and 246 comprising organic material (that may be different than the organic material of the core layer) may be included the IC package assembly 200. It should be understood that the layers 240, 242, 244, 206, and 246 are shown for illustrative purposes only and are not limiting in any way to this description. Different configurations of the IC package assembly 200 may be provided that may utilize the void-free filled interconnect structure 270 described herein.

Additional interconnect structures 260, 262, 280, 282 formed in the layers 206 and 246 of the package substrate 204 may be configured to route electrical signals between the dies 210, 212 and the motherboard (not shown). In some embodiments, the interconnect structures 260, 262, 280, 282 may be configured to route electrical signals such as, for example, input/output (I/O) signals and/or power or ground signals associated with the operation of the dies 210, 212. As shown, the interconnect structures 260, 262, 280, 282 may include vias respectively, formed through the layers 206, 246 of the package substrate 204 to electrically connect the dies 210, 212 with each other or other chipsets and/or with the motherboard (not shown). In some embodiments, the interconnect structures 260, 262, 280, 282 may be filled with a conductive material, such as copper, to provide an electrical connection through the build-up layers 206, 246.

Although two dies 210, 212 are depicted in connection with FIG. 2, other embodiments may include more or fewer dies, layers, and interconnect structures (such as vias, bridges, and the like) connected together in other possible configurations including three-dimensional configurations of an IC package assembly.

FIGS. 3-7 schematically illustrate cross-section side views of an example layer, such as a core layer 244 of the IC package assembly 200 of FIG. 2 showing different stages of forming an interconnect structure for die electric connection, in accordance with some embodiments. More specifically, FIGS. 3-7 illustrate the example core layer 244 of the IC package assembly 200 subsequent to various fabrication operations adapted to form the interconnect structure described herein, in accordance with some embodiments. The core layer is shown for illustrative purposes only, as the void-free filled interconnect structure fabricated as described herein may be applied to any layer made of a dielectric (e.g., organic) material, similar to the core layer 244 discussed above. The void-free filled interconnect structure may be provided by depositing a conductive material to fill the through hole of the interconnect structure, while gradually increasing a current density of the conductive material (e.g., plated copper) and changing a flow rate of the conductive material (e.g., Cu ions) as described below in greater detail.

As described above in reference to FIGS. 1-2, the core layer or other dielectric layer having a void-free filled interconnect structure may be utilized with other layers of the IC package assembly, while not shown. For example, the dies 210, 212 and the layers 240, 242, 206, and 246, omitted from the view in FIGS. 3-7 for the sake of clarity, may be utilized. Additional electrical routing features or interconnect structures such as, for example, conductive lines, vias, and the like (not shown) may be formed in the IC substrate manufacturing process to route the electrical signals between the dies 210,

212. As described in reference to FIGS. 1-2, the conductive layers 240, 242 may be connected through the interconnect structure comprising a void-free filled through hole in core layer 244.

Figure 3:
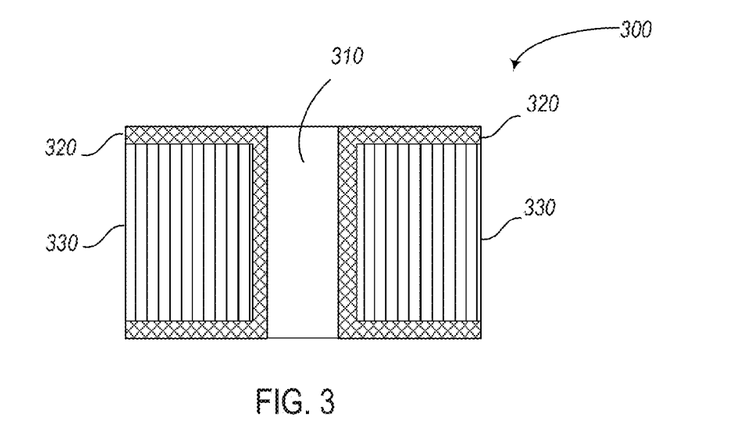
FIGS. 3-7 schematically illustrate cross-section side views of the example dielectric layer of a package substrate subsequent to various void-free filled interconnect structure fabrication operations, in accordance with some embodiments.

Referring now to FIG. 3, the core layer 300 is depicted subsequent to fabricating a through hole 310 in the core layer 300 and preparing the core layer 300 for plating with a conductive material. The through hole 310 may be drilled through the core material 330 of the core layer 300. The drilling may be done using different methods, such as mechanical drilling or laser drilling, for example. In some embodiments, a laser source featuring sufficient silicon absorption may be used to drill through the core layer. There may several challenges associated with laser-drilled through holes, such as laser misalignment top to bottom, asymmetric shape, glass cloth protrusion, and the like. Using the void-free through hole filling described herein, the plating time of filling the through hole void-free may be substantially reduced.

Desmear may be applied after laser drilling in order to clean the through hole 310 and roughen the dielectric surface of the through hole 310. A conductive seed material 320 may be deposited on the package substrate 304. For example, the conductive seed material 320 may be deposited by plating or sputtering the surface of the core layer 300 and the through hole 310. In some embodiments, the plating may be electroless plating, in which a conductive seed material 320, such as copper seed layer is plated across the surfaces of the core layer 300 and the through hole 310.

Figure 4:
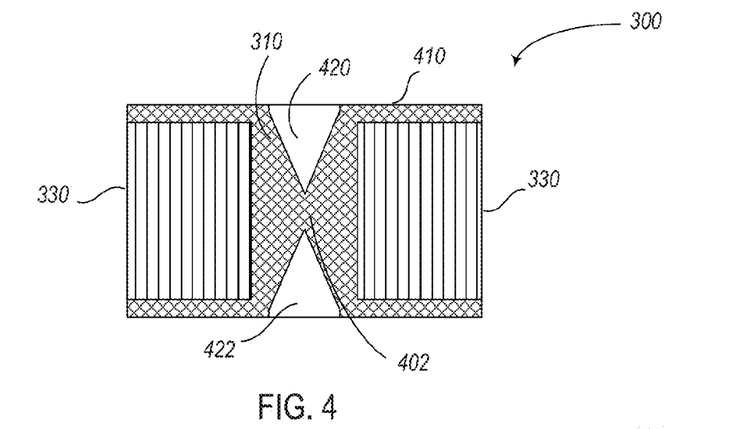

Referring to FIG. 4, the core layer 300 is depicted subsequent to an initial stage of forming a bridge 402 providing openings 420 and 422 inside the through hole 310. More specifically, the core layer 300 is depicted in the process of the application of electrolytic panel plating to the surface of the core layer 300 and the through hole 310 that were prepared as described above in reference to FIG. 3. As a result of electrolytic plating, a conductive material 410, for example, copper, may be plated across the surfaces of the dielectric material 330 and inside the through hole 310 so as to form the openings 420 and 422. The conductive material 410 may be applied in a form of a solution that may include, in different measures, a portion of a conductive materials (e.g., copper) and one or more additives. As shown, the bridge 402 may connect opposing sidewalls of the through hole 310 approximately at a center of the through hole 310 to provide, inside the through hole 310, the openings 420, 422 that each may extend from a respective end of the through hole 310 to the bridge 402.

Accordingly, in some embodiments, the center of the through hole 310 may be closed to form a bridge 402 providing openings 420, 422 by using a small current density of a solution comprising the conductive material and high flow rate of the solution flowing inside the through hole. In some embodiments, the initial stage of the bridge 402 plating shown in FIG. 4 may involve using an average current density of about 0.5-1.5 Amperes per square decimeter (ASD) to form the initial bridge 402. Low current density may prevent the conductive material (e.g., copper) from building up at the protruded edges of the through hole in the core (such as the glass cloth areas and corners), which may cause the copper to physically connect inside the through hole and form a void. The current density may gradually increase with time to about 2-4 ASD as described in reference to FIG. 5. The solution flow rate may be kept within the range of about 9 to 25 cubic meters per hour (m³/h). The current density and solution flow rate ranges described herein are in line with electroplating fundamentals for the particular portions of the plating process described in reference to FIGS. 3-7. One skilled in the art will appreciate that different ranges of current density may be applied with a different chemistry or different equipment configuration. For example, one skilled in the art would appreciate that initial current densities around 0.5-1.5 ASD may be needed at the earlier stages of the plating process, e.g., to prevent early pinch-off.

Figure 5:
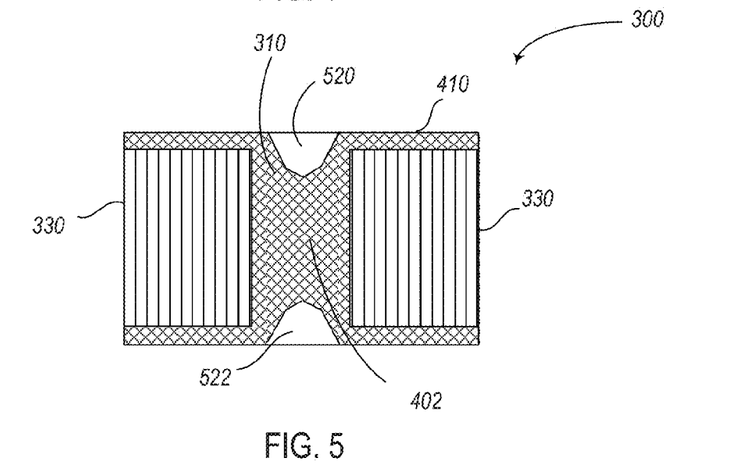

Referring to FIG. 5, the core layer 300 is depicted subsequent to an intermediate stage of thickening the bridge 402 inside the through hole 310 formed as described in reference to FIG. 4. More specifically, the core layer 300 is depicted in the process of continued application of electrolytic panel plating to the surface of the core layer 300, with increased current density and high solution flow. In some embodiments the average current density may be gradually ramped to about 2-4 ASD to increase the thickness of the bridge 402 so as to partially fill the openings 420, 422 to obtain the shallower openings 520, 522. The solution flow rate may remain high (e.g., may be kept within the above-noted range) throughout the bridge 402 plating process to maintain a sufficient supply of Cu ions inside the through hole 310. Keeping a high solution flow rate and a gradually increasing the current density may result, for example, for a 200 um thick core layer 300 dielectric material 330, in a minimal bridge 402 thickness of 100 μm with good suppression at the upper sidewalls so that the openings 520, 522 with dimensions of about 70-80 μm in diameter and about 50 μm in depth may be left for filling.

Generally, the change of the solution flow rate may be used to provide a sufficient supply of Cu ions at the center of the through hole 310 to fabricate the bridge 402 from the flow of the conductive material, as shown in FIGS. 4-5. Lower current densities may be used for the initial stage of bridge formation described in reference to FIGS. 4-5 so as to not close off the mouth of either side of the through hole 310. After the initial bridge formation inside the through hole, the solution flow may be scaled down to enable low recess via filling. The current density may also be ramped up during the openings 520, 522 filling process to maintain void-free through hole filling at an optimal plating time that is suitable for efficient manufacturing.

After completing the bridge 402 plating process as described in reference to FIGS. 4-5, the average current density may be increased further to about 5-6 ASD because the risk of early pinch off may now be low with the remaining openings 520, 522 dimensions that are left to fill with the conductive material. At the same time, the solution flow rate of the conductive material 410 may begin to gradually decrease in the openings filling process. Continuing to use a high flow rate may lead to reduced filling due to the compensation of different solution additives, such as the smaller brightener molecules with leveler molecules in the solution.

Figure 6:
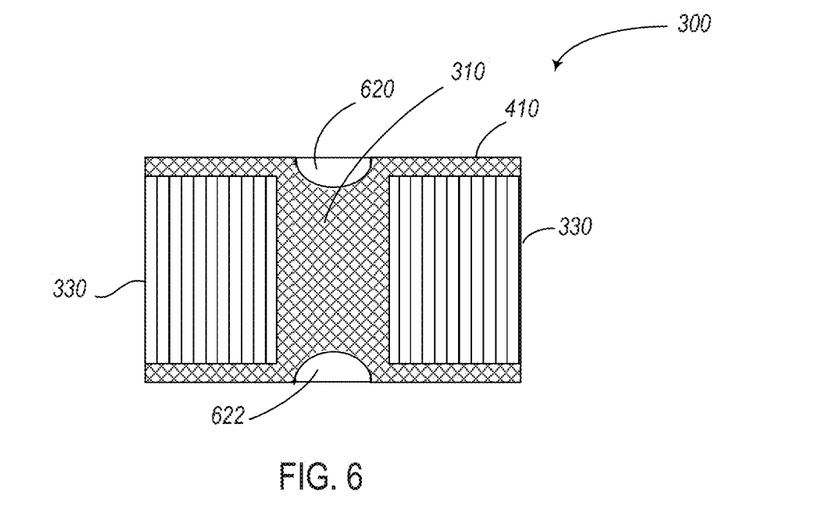
Figure 7:
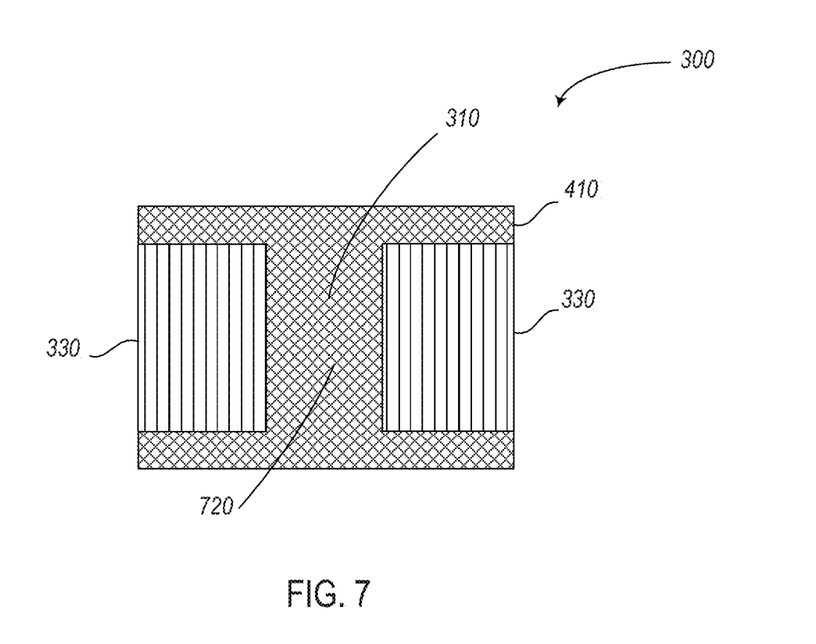

FIGS. 6 and 7 describe operations that may be applied to the core layer 300 subsequent to the plating operations described in reference to FIGS. 4-5 or similar operations resulting in partial filling the openings 420, 422 with a solution comprising a conductive material to so as to have the openings 520, 522. More specifically, the operations include depositing the conductive material by gradually increasing the current density of the conductive material and gradually decreasing the flow rate so as to form void-free filled 720 through hole 310 in the core material 330 of the core layer 300. In some embodiments, the through hole may be filled through the electrolytic Cu plating bath. Accordingly, the Cu may be deposited into the through hole through the plating bath. Referring to FIG. 6 the core layer 300 is depicted subsequent to forming the bridge 402 as described in reference to FIGS. 4-5, and describes a continuing void-free filling of the openings 520, 522 formed by the bridge 402. At this stage, the current density may be gradually increased to about 5-6 ASD, while the solution flow rate of the conductive material 410 may be gradually decreased to about 7-9 m³/h. The continuing gradual increase of the current density (e.g., over 6 ASD) and corresponding gradual decrease of the solution flow (e.g., below 6 m³/h) of the conductive material 410 may lead to complete filling of the gradually reduced openings 620, 622 so as to form void-free filled 720 through hole 310 in the dielectric material 330 of the core layer 300 as illustrated in FIG. 7.

Gradual increase of the current density may allow the through hole to be plated without pinching off the mouth of the through hole. Closing the mouth of the through hole too early with a high current density may lead to voids in the center of the through hole. Starting with a low current density in the bridge plating as described, e.g., in reference to FIG. 4 may avoid this risk. The presence of voids may potentially lead to increased resistance and/or delamination-related failures due to the possible migration of the voids at high operating currents in the through hole interconnect. The solution flow rate also may be controlled to have a highest flow rate at the initial filling stages (FIGS. 4-5) to allow the Cu ions to diffuse into the through hole and fill. A lack of a sufficient amount of Cu ions to reach the center of the through hole during the bridging described in reference to FIGS. 4-5 may also lead to voids in the center of the through hole. After the through hole is bridged with Cu, the solution flow rate may be decreased to prevent the compensation of brightener molecules with leveler molecules and increased etching from other solution additives. Applying a high flow rate may result in increased mass transfer of leveler to the bottom of the opening which may limit the brightener's ability to accelerate the filling inside the opening.

Some solution additives may have the ability to etch Cu at the surface and the shallow portion of the opening at high concentrations and high flow rates. Accordingly, the concentrations of such additives in the solution during the bridging stages (described in reference to FIGS. 4-5) may be adjusted to limit the amount of surface etching at the higher flow, and may be further adjusted during the opening filling stages (described in reference to FIGS. 6-7) to limit the amount of Cu plated on the surface that is expected with the higher average current density that is applied at the end of the void-free filling process (as illustrated in FIG. 7).

As a result of the operations described in reference to FIGS. 3-7, according to various embodiments, electrically conductive void-free filled interconnect structures in a core layer of an IC substrate may be fabricated to route I/O signals, e.g., between the dies mounted on top of the package substrate or between one or more of the dies and another component of a package assembly such as, for example, a circuit board. The implementation of the plating process as described in reference to FIGS. 3-7 may lead to substantial reductions in the plating time (e.g., by 25%). This reduction may in turn lead to significant cost reduction due to the reduction in chemical consumption, number of plating lines, and factory floor space.

Figure 8:
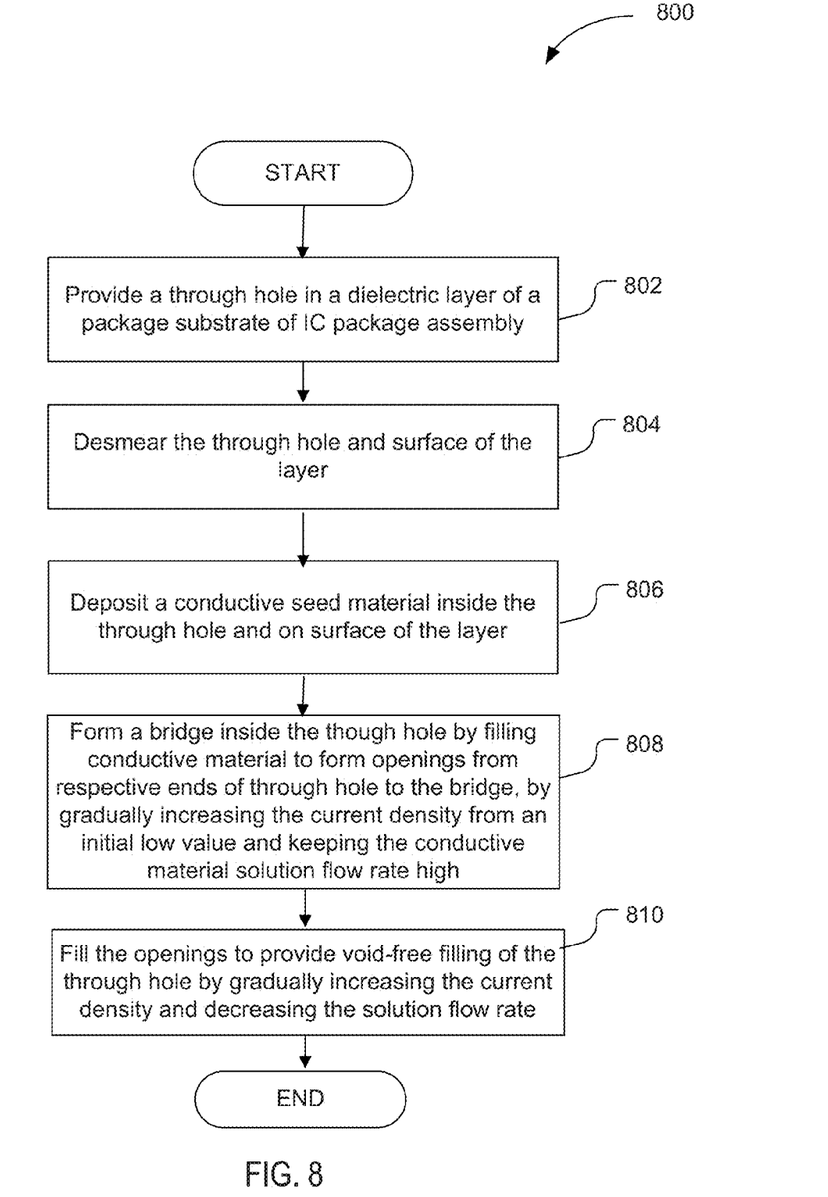
FIG. 8 schematically illustrates a flow diagram for a method of fabricating a void-free filled interconnect structure in a core material of an IC substrate, in accordance with some embodiments.

FIG. 8 schematically illustrates a flow diagram for a method 800 of fabricating a void-free filled interconnect structure in a dielectric layer of an IC package assembly (e.g., the IC package assembly 200 of FIG. 2), in accordance with some embodiments. The method 800 may comport with actions described in connection with FIGS. 1-7 in some embodiments.

At 802, the method 800 may include providing a through hole in a dielectric layer of a package substrate of an IC package assembly. In some embodiments, the through hole may be fabricated by mechanical or laser drilling as described in reference to FIG. 3.

At 804, the method 800 may further include desmearing the through hole and surface of the layer to clean the surfaces of the through hole and the layer as described in reference to FIG. 3.

At 806, the method 800 may further include depositing a seed material having the same chemistry as the conductive material by electroless plating or sputtering to the surface of the layer in the through hole as described in reference to FIG. 3.

At 808, the method 800 may further include forming a bridge inside the though hole by filling the conductive material to form openings from respective ends of through hole to the bridge, by gradually increasing the current density from an initial low value and keeping the conductive material solution flow rate high as described in reference to FIGS. 4-5.

At 810, the method 800 may further include filling the openings to provide void-free filling of the through hole by gradually increasing the current density and decreasing the solution flow rate as described in reference to FIGS. 6-7.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Figure 9:
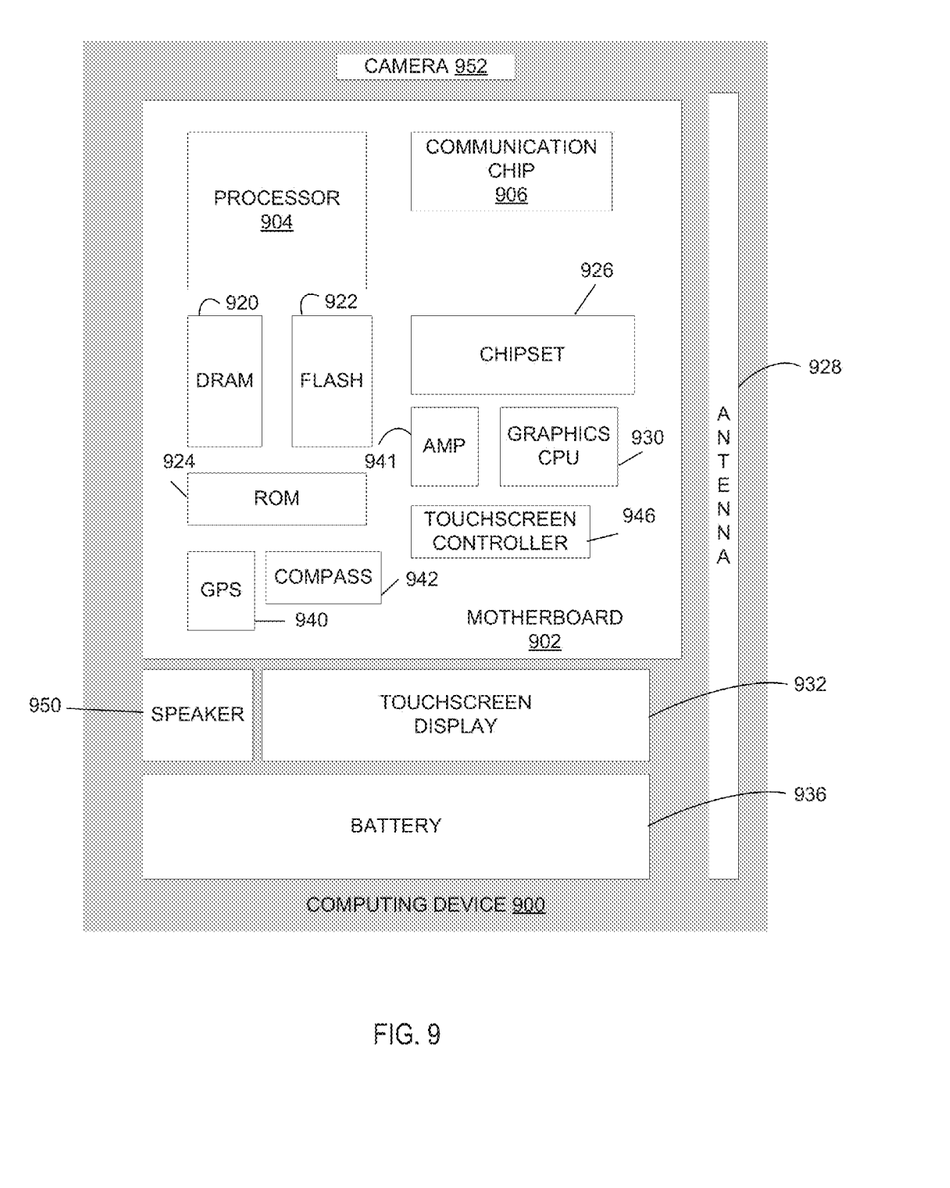
FIG. 9 schematically illustrates an example computing device including an IC package assembly, in accordance with some embodiments.

FIG. 9 schematically illustrates a computing device 900 in accordance with some embodiments. The computing device 900 may house a board such as motherboard 902. The motherboard 902 may include a number of components, including but not limited to a processor 904 and at least one communication chip 906. The processor 904 may be physically and electrically coupled to the motherboard 902. In some implementations, at least one communication chip 906 may also be physically and electrically coupled to the motherboard 902. In further implementations, the communication chip 906 may be part of the processor 904.

Depending on its applications, computing device 900 may include other components that may or may not be physically and electrically coupled to the motherboard 902. These other components may include, but are not limited to, volatile memory (e.g., DRAM) 920, non-volatile memory (e.g., ROM) 924, flash memory 922, a graphics processor 930, a digital signal processor or a crypto processor (not shown), a chipset 926, an antenna 928, a display (e.g., touchscreen display) 932, a touchscreen controller 946, a battery 936, a power amplifier 941, a global positioning system (GPS) device 940, a compass 942, a speaker 950, a camera 952, a mass storage device (such as hard disk drive, compact disk (CD), or digital versatile disk (DVD)), an audio codec, a video codec, a Geiger counter, an accelerometer, a gyroscope, (not shown) and so forth.

The communication chip 906 may enable wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 906 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 906 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 906 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3 G, 4 G, 5 G, and beyond. The communication chip 906 may operate in accordance with other wireless protocols in other embodiments.

The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 may include an IC package assembly (e.g., IC package assembly 100 of FIG. 1) as described herein. For example, an IC substrate (e.g., IC substrate 204 of FIG. 2) having a dielectric (e.g., core) layer with a void-free filled interconnect structure fabricated as described herein may be coupled with a circuit board such as, for example, motherboard 902, using package-level interconnects such as, for example, ball-grid array (BGA) or land-grid array (LGA) structures. The term "processor" may refer to any device or portion of a device that processes electronic data from registers and/or memory to transform that electronic data into other electronic data that may be stored in registers and/or memory.

The communication chip 906 may also include a die (e.g., dies 210, 212 of FIG. 2) in an IC package assembly (e.g., IC package assembly 200 of FIG. 2) as described herein. In further implementations, another component (e.g., memory device or other integrated circuit device) housed within the computing device 900 may contain a die (e.g., dies 210, 212 of FIG. 2) in an IC package assembly as described herein, such as, for example, IC package assembly 200 of FIG. 2 with interconnect structures formed as described in reference to FIGS. 3-8. Such dies may be configured to send or receive signals through a bridge as described herein.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

According to various embodiments, the present disclosure describes a number of examples. Example 1 is a method comprising forming a through hole through a layer of an IC substrate; and depositing a conductive material to fill the through hole, wherein depositing the conductive material is performed while gradually increasing a current density of the conductive material and changing a flow rate of the conductive material.

Example 2 includes the features of Example 1, wherein depositing the conductive material further includes: forming, with the conductive material, a bridge connecting opposing sidewalls of the through hole approximately at a center of the through hole to provide, inside the through hole, a first opening extending from a first end of the through hole to the bridge and a second opening extending from a second end of the through hole to the bridge.

Example 3 includes the features of Example 2, wherein forming the bridge includes gradually increasing the current density of the conductive material from a first current density to a second current density.

Example 4 includes the features of Example 3, wherein gradually increasing the current density from the first current density to the second current density is performed while maintaining a substantially constant flow rate of the conductive material.

Example 5 includes the features of Example 4, wherein the first current density has a value from about 0.5 to 1.5 ampere per square decimeter (ASD) and the second current density has a value from about 2 to 4 ASD, and wherein the substantially constant flow rate has a value from about 9 to 25 cubic meters per hour ($m^3/h$).

Example 6 includes the features of Example 4, wherein depositing the conductive material further includes: after forming the bridge, filling the first opening and the second opening with the conductive material.

Example 7 includes the features of Example 6, wherein filling the first opening and the second opening is performed while gradually increasing the current density of the conductive material from the second current density to a third current density.

Example 8 includes the features of Example 7, wherein the substantially constant flow rate is a first flow rate; and filling the first opening and the second opening is performed while gradually decreasing the flow rate from the first flow rate to a second flow rate.

Example 9 includes the features of Example 8, wherein gradually increasing the current density from the second current density to the third current density and gradually decreasing the flow rate from the first flow rate to the second flow rate are performed simultaneously over a time period.

Example 10 includes the features of Example 8, wherein the third current density has a value from about 5 to 6 ASD; and the second flow rate has a value from about 7 to 9 $m^3/h$.

Example 11 includes the features of Examples 1 to 10, wherein forming the through hole includes drilling through the layer of the substrate using a laser or mechanical drill.

Example 12 includes the features of Example 1, wherein forming the through hole further includes desmearing a surface of the layer in the through hole.

Example 13 includes the features of Example 1, further comprising: prior to depositing the conductive material, depositing a seed material having the same chemistry as the conductive material by electroless plating or sputtering to the surface of the layer in the through hole.

Example 14 includes the features of Example 1, wherein the layer is a core layer comprising a dielectric layer; the conductive material comprises a solution including copper (Cu) and one or more additives; and depositing the conductive material is performed using electrolytic plating.

Example 15 includes product fabricated according to the method of Example 1.

Example 16 is a package assembly comprising: an IC substrate; and an interconnect structure including a through hole filled with a conductive material such that the through hole is substantially void-free, the through hole extending through a layer of the package substrate to provide electrical connectivity between other layers disposed on top and beneath the layer of the package substrate, wherein the conductive material has a void-free structure consistent with being deposited by gradual increase of a current density of the conductive material and corresponding gradual change of a flow rate of the conductive material.

Example 17 includes the features of Example 16, wherein the conductive material includes copper (Cu).

Example 18 includes the features of Example 16, wherein the through hole has a profile that is consistent with being formed by laser drilling.

Example 19 includes the features of Example 16, wherein the layer of the package substrate is a core layer comprising a glass fiber reinforced epoxy system.

Example 20 includes the features of Example 16, wherein the other layers comprise dielectric layers of the package substrate with conducting traces and ground planes.

Example 21 includes the features of Examples 1 to 16, wherein the through hole is substantially void-free such that a void, when detected with an X-ray device, does not exceed 5 micrometers.

Example 22 is an apparatus comprising: a dielectric layer in a substrate; and an interconnect structure including a through hole filled with a conductive material such that the through hole is substantially void-free, the through hole extending through the core layer of the substrate to provide electrical connectivity between conductive layers disposed on top and beneath the layer of the substrate, wherein the conductive material in the through hole has a void-free structure consistent with being deposited by gradual increase of a current density of the conductive material and corresponding gradual change of a flow rate of the conductive material.

Example 23 includes the features of Example 22, wherein the apparatus is configured to provide electrical connection between the conductive layers of an integrated circuit board.

Example 24 is an apparatus including means for forming a through hole through a layer of an IC substrate; and means for depositing a conductive material to fill the through hole, wherein depositing the conductive material is performed while gradually increasing a current density of the conductive material and changing a flow rate of the conductive material.

Example 25 includes the features of Example 24, wherein means for depositing include means for forming, with the conductive material, a bridge connecting opposing sidewalls of the through hole approximately at a center of the through hole to provide, inside the through hole, a first opening extending from a first end of the through hole to the bridge and a second opening extending from a second end of the through hole to the bridge.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A method, comprising:
   forming a through hole through a layer of an integrated circuit (IC) substrate;
   depositing a conductive material to fill the through hole, wherein depositing the conductive material is performed while gradually increasing a current density of the conductive material and changing a flow rate of the conductive material; and
   forming, with the conductive material, a bridge connecting opposing sidewalls of the through hole approximately at a center of the through hole to provide, inside the through hole, a first opening extending from a first end of the through hole to the bridge and a second opening extending from a second end of the through hole to the bridge.

2. The method of claim 1, wherein forming the bridge includes gradually increasing the current density of the conductive material from a first current density to a second current density.

3. The method of claim 2, wherein gradually increasing the current density from the first current density to the second current density is performed while maintaining a substantially constant flow rate of the conductive material.

4. The method of claim 3, wherein the first current density has a value from about 0.5 to 1.5 ampere per square decimeter (ASD) and the second current density has a value from about 2 to 4 ASD, and wherein the substantially constant flow rate has a value from about 9 to 25 cubic meters per hour ($m^3/h$).

5. The method of claim 3, wherein depositing the conductive material further includes:
   after forming the bridge, filling the first opening and the second opening with the conductive material.

6. The method of claim 5, wherein filling the first opening and the second opening is performed while gradually increasing the current density of the conductive material from the second current density to a third current density.

7. The method of claim 6, wherein:
   the substantially constant flow rate is a first flow rate; and
   filling the first opening and the second opening is performed while gradually decreasing the flow rate from the first flow rate to a second flow rate.

8. The method of claim 7, wherein gradually increasing the current density from the second current density to the third current density and gradually decreasing the flow rate from the first flow rate to the second flow rate are performed simultaneously over a time period.

9. The method of claim 7, wherein:
the third current density has a value from about 5 to 6 ampere per square decimeter (ASD); and
the second flow rate has a value from about 7 to 9 $m^3/h$.

10. The method of claim 1, wherein forming the through hole includes drilling through the layer of the substrate using a laser or mechanical drill.

11. The method of claim 10, wherein forming the through hole further includes desmearing a surface of the layer in the through hole.

12. The method of claim 11, further comprising:
prior to depositing the conductive material, depositing a seed material having the same chemistry as the conductive material by electroless plating or sputtering to the surface of the layer in the through hole.

13. The method of claim 1, wherein:
the layer is a core layer comprising a dielectric layer;
the conductive material comprises a solution including copper (Cu) and one or more additives; and
depositing the conductive material is performed using electrolytic plating.

14. A product fabricated according to the method of claim 1.

15. A package assembly comprising:
an integrated circuit (IC) substrate; and
an interconnect structure including a through hole filled with a conductive material such that the through hole is substantially void-free, the through hole extending through a layer of the package substrate to provide electrical connectivity between other layers disposed on top and beneath the layer of the package substrate,
wherein the conductive material has a substantially void-free structure consistent with being deposited by gradual increase of a current density of the conductive material and corresponding gradual change of a flow rate of the conductive material, and wherein the other layers comprise dielectric layers of the package substrate with conducting traces and ground planes.

16. The package assembly of claim 15, wherein the conductive material includes copper (Cu).

17. The package assembly of claim 15, wherein the through hole has a profile that is consistent with being formed by laser drilling.

18. The package assembly of claim 15, wherein the layer of the package substrate is a core layer comprising a glass fiber reinforced epoxy system.

19. The package assembly of claim 15, wherein the through hole is substantially void-free such that a void, when detected with an X-ray device, does not exceed 5 micrometers.

20. An apparatus comprising:
a dielectric layer in a substrate; and
an interconnect structure including a through hole filled with a conductive material such that the through hole is substantially void-free, the through hole extending through the core layer of the substrate to provide electrical connectivity between conductive layers disposed on top and beneath the layer of the substrate,
wherein the conductive material in the through hole has a substantially void-free structure consistent with being deposited by gradual increase of a current density of the conductive material and corresponding gradual change of a flow rate of the conductive material.

21. The apparatus of claim 20, wherein the apparatus is configured to provide electrical connection between the conductive layers of an integrated circuit board.

* * * * *